United States Patent [19]
Merritt et al.

[11] Patent Number: 5,831,932
[45] Date of Patent: *Nov. 3, 1998

[54] SELF-ENABLING PULSE-TRAPPING CIRCUIT

[75] Inventors: Todd Merritt, Boise; Brett Williams, Eagle, both of Id.

[73] Assignee: Micron Technology, Inc., Boise, Id.

[ * ] Notice: The term of this patent shall not extend beyond the expiration date of Pat. Nos. 5,706,247 and 5,640,364.

[21] Appl. No.: 914,659

[22] Filed: Aug. 19, 1997

Related U.S. Application Data

[63] Continuation of Ser. No. 754,308, Nov. 21, 1996, Pat. No. 5,706,247, which is a continuation of Ser. No. 568,358, Dec. 6, 1995, Pat. No. 5,640,364, which is a continuation-in-part of Ser. No. 370,761, Dec. 23, 1994, Pat. No. 5,526,320.

[51] Int. Cl.$^6$ ..................................................... G11C 8/00
[52] U.S. Cl. .................. 365/233.5; 365/233; 365/230.08
[58] Field of Search .......................... 365/233.5, 230.08, 365/238.5, 189.05, 206, 230.06

[56] References Cited

U.S. PATENT DOCUMENTS

| | | | |
|---|---|---|---|
| 4,344,156 | 8/1982 | Eaton et al. | 365/203 |
| 4,484,308 | 11/1984 | Lewandowski et al. | 364/900 |
| 4,510,603 | 4/1985 | Catiller | 371/21 |

(List continued on next page.)

OTHER PUBLICATIONS

"Rossini, Pentium, PCI–ISA, Chip Set", *Symphony Laboratories*, entire book.

"4DRAM 1991", *Toshiba America Electronic Components, Inc.*, pp. A–137–A–159.

"Application Specific DRAM", *Toshiba America Electronic Components, Inc.*, C178, C–260, C 218, (1994).

"Burst DRAM Function & Pinout", *Oki Electric Ind., Co., Ltd., 2nd Presentation, Item #619*, (Sep. 1994).

"DRAM 1 Meg × 4 DRAM 5VEDO Page Mode", *Micron Technology, Inc. 1995 DRAM Data Book*, pp. 1–1 thru 1–30.

"Hyper Page Mode DRAM", *Electronic Engineering*, 66, Woolwich, London, GB, pp. 47–48, (Sep. 1994).

"Mosel–Vitelic (V53C8257H DRAM Specification Sheet", 20 pgs., (Jul. 2, 1994).

"Pipelined Burst DRAM", *Toshiba, JEDEC JC 42.3 Hawaii*, (Dec. 1994).

"Samsung Synchronous DRAM", *Revision 1*, Samsung Electronics, 1–16, (Mar., 1993).

"Synchronous DRAM 2 MEG × 8 SDRAM", *Micron Semiconductors, Inc.*, 2–8 to 2–43.

Bursky, D., "Novel I/O Options and Innovative Architectures Let DRAMs Achieve SRAM Performance; Fast DRAMS can be swapped for SRAM Caches", *Electronic Design*, 41, pp. 55–67, (Jul. 22, 1993).

Gowni, et al., "Synchronous Cache RAM with Burst; Mode Access", *IEEE 1992 Custom Integrated Circuits Conference*, Boston, USA, pp. 781–784, (May 1992).

Gowni, S.P., et al., "A 9NS, 32K × 9, BISMOS TTL Synchronous Cache RAM With Burst Mode Access", *Proc.: IEEE Custom Integrated Circuits Conf.*, pp. 781–786, (Mar. 3, 1992).

*Primary Examiner*—Tan T. Nguyen
*Attorney, Agent, or Firm*—Schwegman, Lundberg, Woessner & Kluth, P.A.

[57] ABSTRACT

An integrated circuit memory device is described which can operate at high data speeds. The memory device can either store or retrieve data from the memory in a burst access operation. The burst operations latches a memory address from external address lines and internally generates additional memory addresses. An external input is used to terminate and change a burst operation. Circuitry is provided to monitor the external input during burst operations and provide an appropriate control signal.

23 Claims, 8 Drawing Sheets

U.S. PATENT DOCUMENTS

| | | | |
|---|---|---|---|
| 4,513,389 | 4/1985 | Devchoudhury | 364/900 |
| 4,562,555 | 12/1985 | Ouchi et al. | 365/233 |
| 4,567,579 | 1/1986 | Patel et al. | 365/189 |
| 4,575,825 | 3/1986 | Ozaki et al. | 365/189 |
| 4,603,403 | 7/1986 | Toda | 365/189 |
| 4,618,947 | 10/1986 | Tran et al. | 365/230 |
| 4,636,986 | 1/1987 | Pinkham | 365/230.08 |
| 4,649,522 | 3/1987 | Kirsch | 365/189 |
| 4,685,089 | 8/1987 | Patel et al. | 365/233 |
| 4,707,811 | 11/1987 | Takemae et al. | 365/239 |
| 4,750,839 | 6/1988 | Wang et al. | 365/233 |
| 4,788,667 | 11/1988 | Nakano et al. | 365/193 |
| 4,799,199 | 1/1989 | Scales et al. | 365/230 |
| 4,870,622 | 9/1989 | Aria et al. | 365/230.02 |
| 4,875,192 | 10/1989 | Matsumoto | 365/193 |
| 4,984,217 | 1/1991 | Sato | 365/230 |
| 5,058,066 | 10/1991 | Yu | 365/189.05 |
| 5,083,296 | 1/1992 | Hara et al. | 365/230.08 |
| 5,126,975 | 6/1992 | Handy et al. | 365/230.01 |
| 5,210,723 | 5/1993 | Bates et al. | 365/238.5 |
| 5,267,200 | 11/1993 | Tobita | 365/189.05 |
| 5,268,865 | 12/1993 | Takasugi | 365/189.05 |
| 5,280,594 | 1/1994 | Young et al. | 395/425 |
| 5,305,284 | 4/1994 | Iwase | 365/238.5 |
| 5,319,759 | 6/1994 | Chan | 395/400 |
| 5,325,330 | 6/1994 | Morgan | 365/189.05 |
| 5,325,502 | 6/1994 | McLaury | 395/425 |
| 5,339,276 | 8/1994 | Takasugi | 365/230 |
| 5,349,566 | 9/1994 | Merritt et al. | 365/233.5 |
| 5,357,469 | 10/1994 | Sommer et al. | 365/193 |
| 5,373,227 | 12/1994 | Keeth | 323/313 |
| 5,379,261 | 1/1995 | Jones, Jr. | 365/230.08 |
| 5,386,385 | 1/1995 | Stephens, Jr. | 365/189.05 |
| 5,392,239 | 2/1995 | Margulis et al. | 365/189.01 |
| 5,410,670 | 4/1995 | Hansen et al. | 395/425 |
| 5,436,869 | 7/1995 | Yoshida | 365/230 |
| 5,449,941 | 9/1995 | Yamazaki et al. | 257/411 |
| 5,452,261 | 9/1995 | Chung et al. | 365/233 |
| 5,454,107 | 9/1995 | Lehman et al. | 395/480 |
| 5,457,659 | 10/1995 | Schaefer | 365/222 |
| 5,483,498 | 1/1996 | Hotta | 365/233.5 |
| 5,485,428 | 1/1996 | Lin | 365/221 |
| 5,487,049 | 1/1996 | Hang | 365/221 |
| 5,513,148 | 4/1996 | Zager | 365/233 |
| 5,526,320 | 6/1996 | Zagar et al. | 365/233.5 |
| 5,640,364 | 6/1997 | Merritt et al. | 365/233.5 |
| 5,706,247 | 1/1998 | Merritt et al. | 365/233.5 |

| | WE* CAS* | | | |
|---|---|---|---|---|
| | 0  1 | 0  0 | 1  0 | X  1 |
| $A_2$ | 1 | 1 | 0 | 0 |
| $B_2$ | 0 | 1 | 1 | 1 |
| $C_2$ | 1 | 1 | 1 | 0 |
| $D_2$ | 0 | 0 | 0 | 1 |
| $E_2$ | 1 | 1 | 1 | ⊓ |

| | WE* CAS* | | | |
|---|---|---|---|---|
| | 1  1 | 1  0 | 0  0 | X  1 |
| $A_1$ | 0 | 0 | 1 | 1 |
| $B_1$ | 1 | 1 | 1 | 0 |
| $C_1$ | 0 | 0 | 0 | 1 |
| $D_1$ | 1 | 1 | 1 | 0 |
| $E_1$ | 1 | 1 | 1 | ⊓_ |

SELF-ENABLING PULSE-TRAPPING CIRCUIT

This application is a continuation of U.S. patent application Ser. No. 08/754,308, filed Nov. 21, 1996, now U.S. Pat. No. 5,706,247 which is a continuation of Ser. No. 568,358, filed Dec. 6, 1995, now U.S. Pat. No. 5,640,364, issued on Jun. 17, 1997, which is a continuation-in-part of U.S. application Ser. No. 08/370,761, filed Dec. 23, 1994, now U.S. Pat. No. 5,526,320.

TECHNICAL FIELD OF THE INVENTION

The present invention relates generally to integrated circuit memories and in particular the present invention relates to a circuit and method of latching an input signal.

BACKGROUND OF THE INVENTION

There are a number of integrated circuit memories commercially available. For example, dynamic memory circuits having memory cells arranged to be accessed in a random fashion are referred to as dynamic random access memories, DRAMs. These memories can be produced in a variety of designs which provide different methods of reading from and writing to the dynamic memory cells. One such method is page mode operations. Page mode operations in a DRAM are defined by the method of accessing a row of a memory cell array and randomly accessing different columns of the array. Data stored at the row and column intersection can be output while that column is accessed. An alternate type of memory access is the extended data output (EDO) memory which allows data stored at a memory array address to be available as output after the addressed column has been closed. A more detailed description of a DRAM having EDO features is provided in the "1995 DRAM Data Book" pages 1-1 to 1-30 available from Micron Technology, Inc. Boise, Idaho, the assignee of the present application and is incorporated herein by reference. Yet another type of operation is included in a burst EDO memory which adds the ability to address one column of a memory array and then automatically address additional columns in a pre-determined manner without providing the additional column addresses on external address lines.

In a burst memory, external inputs can be used to terminate a burst access operation. Timing and pulse width requirements are traditionally placed on signals provided on these external inputs. If the minimum timing or pulse width requirements placed on the external inputs are excessive, an error can occur when a short pulse width signal is provided on the input and a burst operation will not be terminated. For the reasons stated above, and for other reasons stated below which will become apparent to those skilled in the art upon reading and understanding the present specification, there is a need in the art for a circuit which can monitor external inputs by reducing critical timing and substantially independent of signal pulse width.

SUMMARY OF THE INVENTION

The above mentioned problems with memory devices and other problems are addressed by the present invention and which will be understood by reading and studying the following specification. A latching circuit is described which monitors an external input for transitions during a burst access operation.

In particular, one embodiment of the present invention describes an integrated memory device comprising a control signal input for receiving a control signal, an address latch input for receiving an address latch signal, and a signal trapping circuit coupled to the control signal input and the address latch input and adapted to latch a transition in the control signal. The signal trapping circuit can comprise a low transition latch circuit to latch a high to low transition in the control signal when the address latch signal is activated, and a high transition latch circuit to latch a low to high transition in the control signal when the address latch signal is activated.

In another embodiment, an integrated memory circuit is described which can comprise a write enable input for receiving a write enable signal, an address latch input for receiving an address latch signal, and a signal trapping circuit coupled to the write enable input and the address latch input and adapted to latch a transition in the write enable signal. The signal trapping circuit comprises a low transition latch circuit to latch a high to low transition in the write enable signal when the address latch input is activated, a high transition latch circuit to latch a low to high transition in the write enable signal when the address latch input is activated, and a pulse generator circuit coupled to the low transition latch circuit and the high transition latch circuit to generate a pulse in response to an output of the low transition latch circuit and the high transition latch circuit.

In yet another embodiment, a method is described for latching a control signal in a memory circuit having a control signal input and an address latch input. The method comprises the steps of receiving an address latch signal on the address latch input, receiving a control signal on the control signal input, enabling a latch circuit in response to an active transition of the address latch signal, and latching a transition of the control signal.

BRIEF DESCRIPTION OF THE DRAWINGS

FIG. 6b is a timing diagram of the circuit of FIG. 6a;

FIG. 7b is a timing diagram of the circuit of FIG. 7a;

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims. The present invention can be implemented in any memory, but is particularly advantageous in a burst access memory.

BURST ACCESS MEMORY

Figure 1:
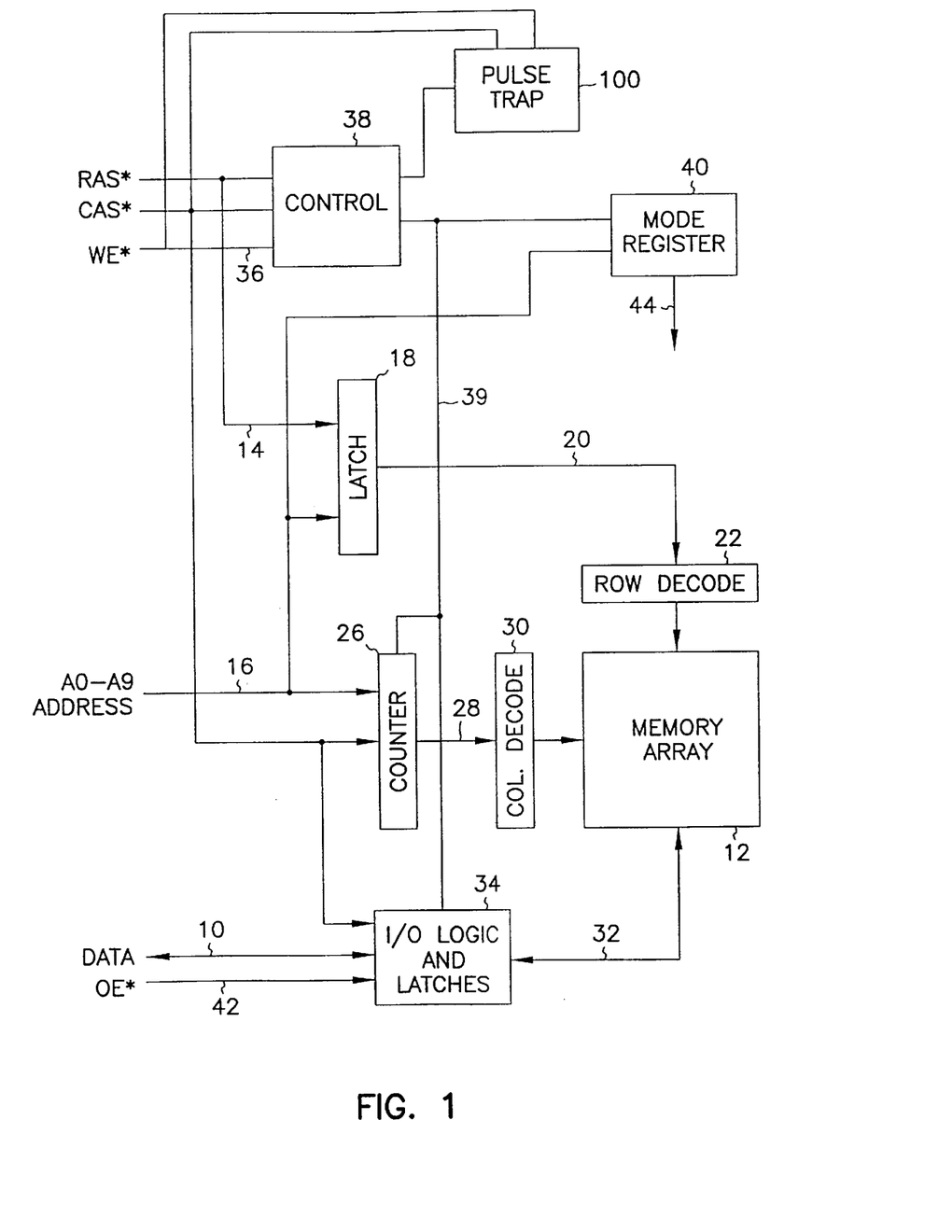
FIG. 1 is a block diagram of a memory circuit incorporating the features of the present invention.

FIG. 1 is a schematic representation of a sixteen megabit device designed in accordance with the present invention. The device is organized as a 2 Meg × 8 Burst EDO DRAM having an eight bit data input/output path 10 providing data storage for 2,097,152 bytes of information in the memory array 12. The device of FIG. 1 may have an industry standard pinout for eight bit wide EDO DRAMs. An active-low row address strobe (RAS*) signal 14 is used to latch a first portion of a multiplexed memory address, from address inputs 16, in latch 18. The latched row address 20 is decoded in row decoder 22. The decoded row address is used to select a row of the memory array 12. A column address strobe (CAS*) signal 24 is used to latch a second portion of a memory address from address inputs 16 into address generation circuit 26. The latched column address 28 is decoded in column address decoder 30. The decoded column address is used to select a column of the memory array 12.

In a burst read cycle, data within the memory array located at the row and column address selected by the row and column address decoders is read out of the memory array and sent along data path 32 to output latches. Data 10 driven from the burst EDO DRAM may be latched external to the device in synchronization with CAS* after a predetermined number of CAS* cycle delays (latency). For a two cycle latency design, the first CAS* falling edge is used to latch the initial address for the burst access. The first burst data from the memory is driven from the memory after the second CAS* falling edge, and remains valid through the third CAS* falling edge. Once the memory device begins to output data in a burst read cycle, the output drivers 34 will continue to drive the data lines without tri-stating the data outputs during CAS* high intervals dependent on the state of the output enable and write enable (OE* and WE*) control lines, thus allowing additional time for the system to latch the output data. The data outputs remain valid throughout the burst read cycles with the exception of brief periods of data transition. During these periods of data transition, the output drivers may be turned off momentarily in order to aid data transition. This state of the output buffer should not be confused with the standard DRAM tri-state condition which is intended to release the data bus.

Once a row and a column address are selected, additional transitions of the CAS* signal are used to advance the column address within the address generation circuit in a predetermined sequence. The address may be advanced linearly, or in an interleaved fashion for maximum compatibility with the overall system requirements. The time at which data will be valid at the outputs of the burst EDO DRAM is dependent only on the timing of the CAS* signal provided that OE* is maintained low, and WE* remains high. The output data signal levels may be but are not limited to being driven in accordance with standard CMOS, TTL, LVTTL, GTL, or HSTL output level specifications.

In the burst access memory device, each new column address from the address generation circuit is decoded and is used to access additional data within the memory array without the requirement of additional column addresses being specified on the address inputs 16. This burst sequence of data will continue for each CAS* falling edge until a predetermined number of data accesses equal to the burst length has occurred. A CAS* falling edge received after the last burst address has been generated will latch another column address from the address inputs 16 and a new burst sequence will begin. Read data is latched and output with each falling edge of CAS* after the first CAS* latency.

For a burst write cycle, data 10 is latched in input data latches 34. Data targeted at the first address specified by the row and column addresses is latched with the CAS* signal when the first column address is latched (write cycle data latency is zero). Other write cycle data latency values are possible; however, for today's memory systems, zero is preferred. Additional input data words for storage at incremented column address locations are latched by CAS* on successive CAS* pulses. Input data from the input latches 34 is passed along data path 32 to the memory array where it is stored at the location selected by the row and column address decoders. As in the burst read cycle previously described, a predetermined number of burst access writes will occur without the requirement of additional column addresses being provided on the address lines 16. After the predetermined number of burst writes has occurred, a subsequent CAS* pulse will latch a new beginning column address, and another burst read or write access will begin.

The write enable signal is used in burst access cycles to select read or write burst accesses when the initial column address for a burst cycle is latched by CAS*. WE* low at the column address latch time selects a burst write access. WE* high at the column address latch time selects a burst read access. The level of the signal must remain high for read and low for write burst accesses throughout the burst access. A low to high transition within a burst write access will terminate the burst access, preventing further writes from occurring. A high to low transition on WE* within a burst read access will likewise terminate the burst read access and will place the data output 10 in a high impedance state.

Figure 2:
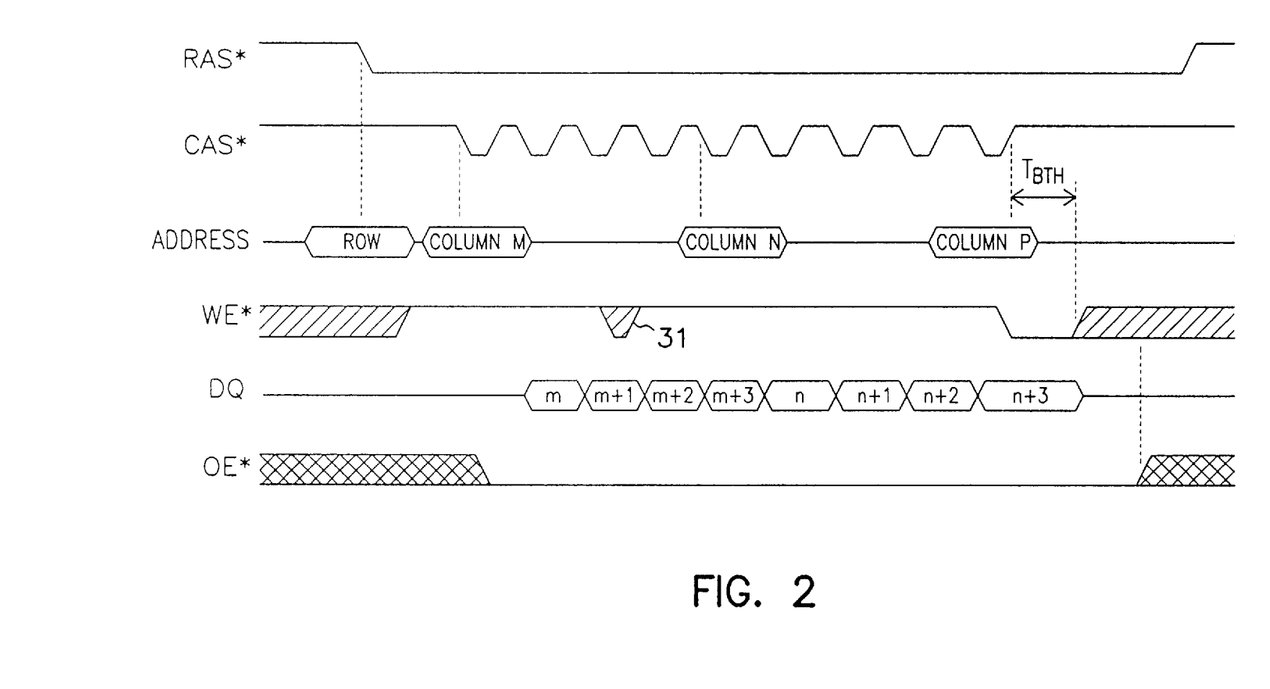
FIG. 2 is a timing diagram of a burst memory not including the features of the present invention.

In a standard burst access memory device, the WE* signal required a minimum pulse width defined by time $T_{BTH}$ following the rising edge of CAS* to terminate a burst access. For a memory not including the present invention, FIG. 2 illustrates both the minimum pulse width $T_{BTH}$, and a WE* low pulse 31 which is less that $T_{BTH}$. After the critical timing period, the state of WE* is used to determine whether a burst access continues, is initiated, or is terminated. A minimum write enable pulse width is only required when it is desired to terminate a burst read and then begin another burst read, or terminate a burst write prior to performing another burst write with a minimum delay between burst accesses.

Termination of a burst access places the DRAM in a state to receive another burst access command. Both RAS* and CAS* going high during a burst access will also terminate the burst access cycle and place the data drivers in a high impedance output state. Read data may remain valid at the device outputs if RAS* alone goes high while CAS* is active for compatibility with hidden refresh cycles, otherwise RAS* high alone may be used to terminate a burst access. In the case of burst reads, WE* will transition from high to low to terminate a first burst read, and then WE* will transition back high prior to the next falling edge of CAS* in order to specify a new burst read cycle. For burst writes, WE* would transition high to terminate a current burst write access, then back low prior to the next falling edge of CAS* to initiate another burst write access. A basic implementation of the device of FIG. 1 may include a fixed burst length of 4, a fixed CAS* latency of 2 and a programmable sequence of burst addresses.

This basic implementation requires very little additional circuitry to the standard EDO page mode DRAM, and may be mass produced to provide the functions of both the standard EDO page mode and burst EDO DRAMs. This device also allows for the output enable pin (OE*) to be grounded for compatibility with many SIMM module designs. When not disabled (tied to ground), OE* is an asynchronous control which will prevent data from being driven from the part in a read cycle if it is inactive (high) prior to CAS* falling and remains inactive beyond CAS* rising. If these setup and hold conditions are not met, then the read data may be driven for a portion of the read cycle. It is possible to synchronize the OE* signal with CAS*, however this would typically increase the CAS* to data valid delay time and doesn't allow for the read data to be disabled prior to RAS* high without an additional CAS* low pulse which would otherwise be unnecessary. In a preferred embodiment, if OE* transitions high at any time during a read cycle the outputs will remain in a high impedance state until the next falling edge of CAS* despite further transitions of the OE* signal.

Programmability of the burst length, CAS* latency and address sequences may be accomplished through the use of a mode register 40. Burst length options of 2, 4, 8 and full page as well as CAS* latencies of 1, 2 and 3 may be provided. Other burst length and latency options may be provided as the operating speeds of the device increase, and computer architectures evolve. The burst length and CAS* latency for this particular embodiment are fixed. Other possible alterations in the feature sets of this DRAM include having a fixed burst mode only, selecting between standard fast page mode (non-EDO) and burst mode, and using the output enable (OE*) 42 in combination with RAS* to select between modes of operation. A more complex memory device may provide additional modes of operation such as switching between fast page mode, EDO page mode, static column mode and burst operation through the use of various combinations of WE* and OE* at RAS* falling time. One mode from a similar set of modes may be selected. Alternately, a device with multiple modes of operation may have wire bond locations, or programmable fuses which may be used to program the mode of operation of the device.

The present invention is described with reference to several preferred embodiments. Just as fast page mode DRAMs and EDO DRAMs are available in numerous configurations including x1, x4, x8 and x16 data widths, and 1 Megabit, 4 Megabit, 16 Megabit and 64 Megabit densities; the memory device of the present invention may take the form of many different memory organizations. It is believed that one who is skilled in the art of integrated circuit memory design can, with the aide of this specification design a variety of memory devices which do not depart from the spirit of this invention. It is therefore believed that detailed descriptions of all of the various memory device organizations applicable to this invention are not necessary.

Figure 3:
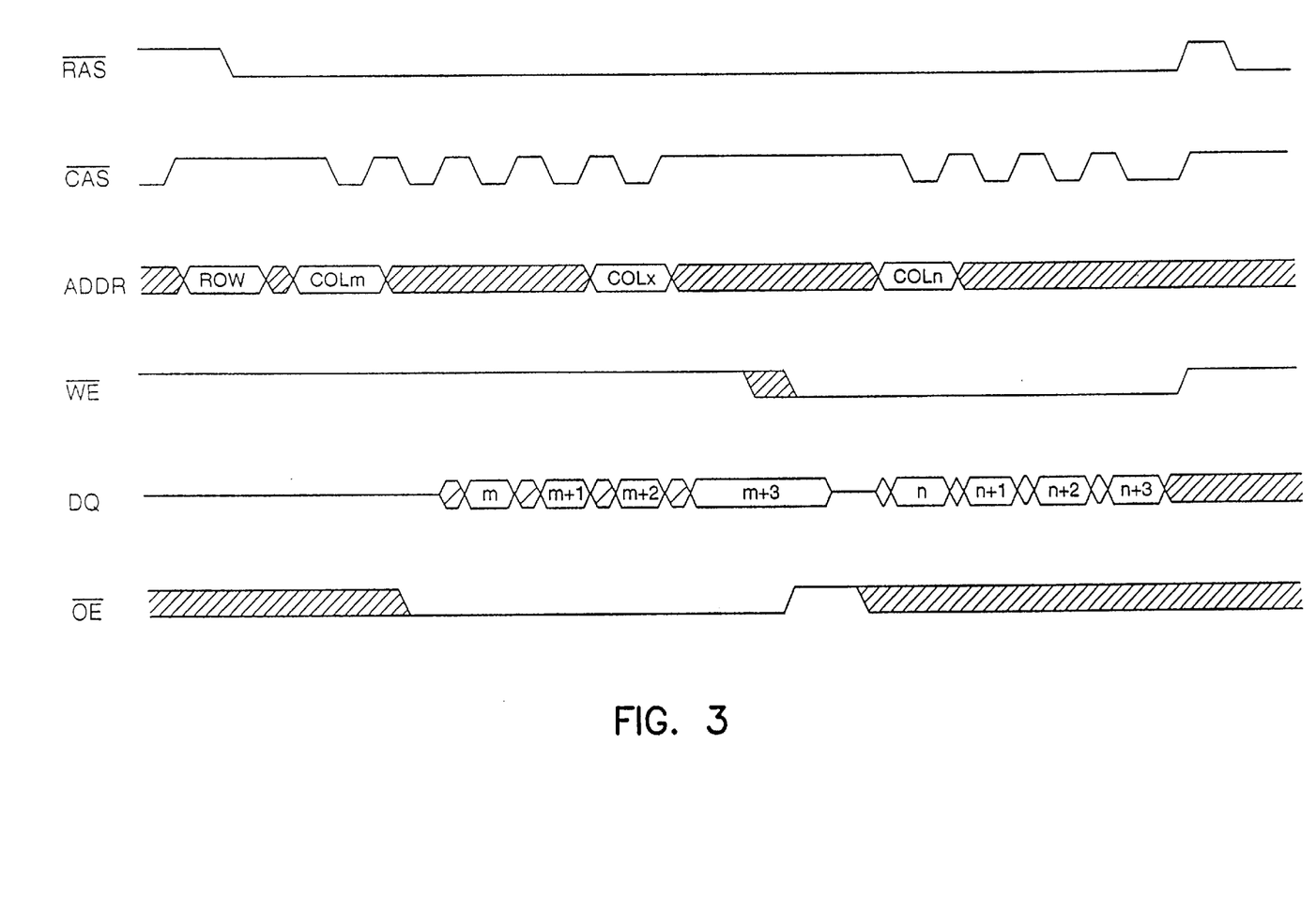
FIG. 3 is a timing diagram of a burst read followed by burst write operation in the memory if FIG. 1.

FIG. 3 is a timing diagram for performing a burst read followed by burst write of the device of FIG. 1. In FIG. 3, a row address is latched by the RAS* signal. WE* is low when RAS* falls for an embodiment of the design where the state of the WE* pin is used to specify a burst access cycle at RAS* time. Next, CAS* is driven low with WE* high to initiate a burst read access, and the column address is latched. The data out signals (DQ's) are not driven in the first CAS* cycle. On the second falling edge of the CAS* signal the first data out is driven from the device after a CAS* to data access time (tCAC). Additional burst access cycles continue, for a device with a specified burst length of four, until the fifth falling edge of CAS* which latches a new column address for a new burst read access. WE* falling in the fifth CAS* cycle terminates the burst access, tri-states the data bus, and initializes the device for additional burst accesses. The sixth falling edge of CAS* with WE* low is used to latch a new burst address, latch input data and begin a burst write access of the device. Additional data values are latched on successive CAS* falling edges until RAS* rises to terminate the burst access.

Figure 4:
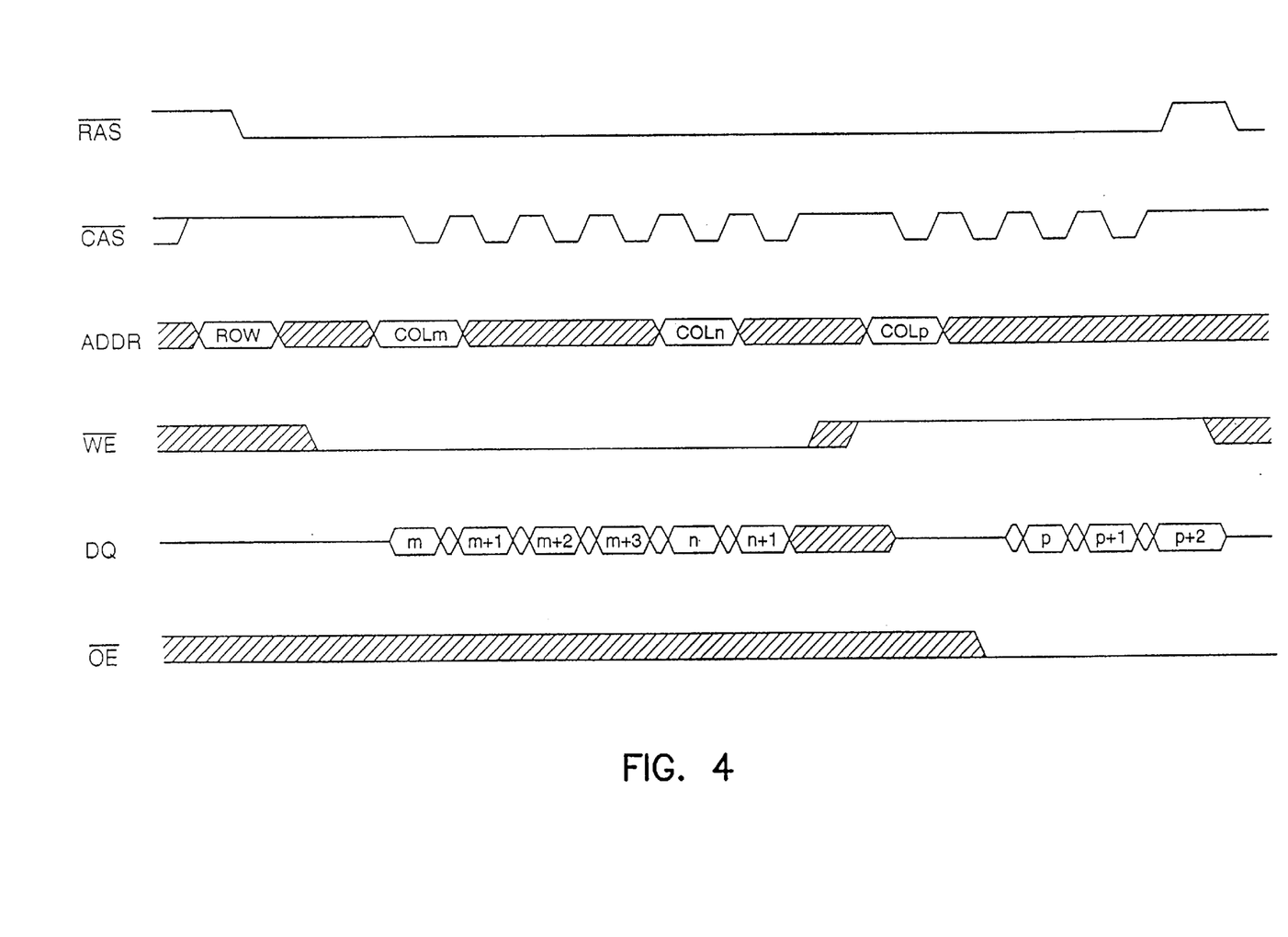
FIG. 4 is a timing diagram of burst write access cycles followed by burst read cycles in the memory of FIG. 1.

FIG. 4 is a timing diagram depicting burst write access cycles followed by burst read cycles. As in FIG. 3, the RAS* signal is used to latch the row address. WE* is shown as a "don't care" at the time RAS* falls for an embodiment of the present invention that does not utilize the state of WE* at RAS* time to select between burst and non-burst access modes. The first CAS* falling edge in combination with WE* low begins a burst write access with the first data being latched. Additional data values are latched with successive CAS* falling edges, and the memory address is advanced internal to the device in either an interleaved or sequential manner which has been previously programmed. On the fifth CAS* failing edge a new column address and associated write data are latched. The burst write access cycles continue until the WE* signal goes high in the sixth CAS* cycle. The transition of the WE* signal terminates the burst write access. The seventh CAS* low transition latches a new column address and begins a burst read access (WE* is high). The burst read continues until RAS* rises terminating the burst cycles.

It should be noted from FIGS. 3 and 4, that for burst read cycles the data remains valid on the device outputs as long as the OE* pin is low, except for brief periods of data transition. Also, since the WE* pin is low prior to or when CAS* falls, the data input/output lines are not driven from the part during write cycles, and the OE* pin may be grounded. Only the CAS* signal and the data signals toggle at relatively high frequency, and no control signals other than CAS* are required to be in an active or inactive state for one CAS* cycle time or less.

PULSE TRAPPING CIRCUIT

It will be appreciated that the critical timing and minimum pulse width requirement of $T_{BTH}$ on the WE* input can unnecessarily slow the operation of the memory circuit. The elimination of this requirement can be accomplished by including the pulse trapping circuit 100 shown in detail in FIG. 5. The pulse trapping circuit operates to latch either a high transition or a low transition in the WE* signal while CAS* is low. The transition which is latched will depend upon the state of the WE* signal when the CAS* signal transitions low. That is, if WE* is high when CAS* goes low, the pulse trapping circuit will look for and latch a low transition in WE*. If WE* is low when CAS* goes low, the pulse trapping circuit will look for and latch a high transition in WE*.

Figure 7A:
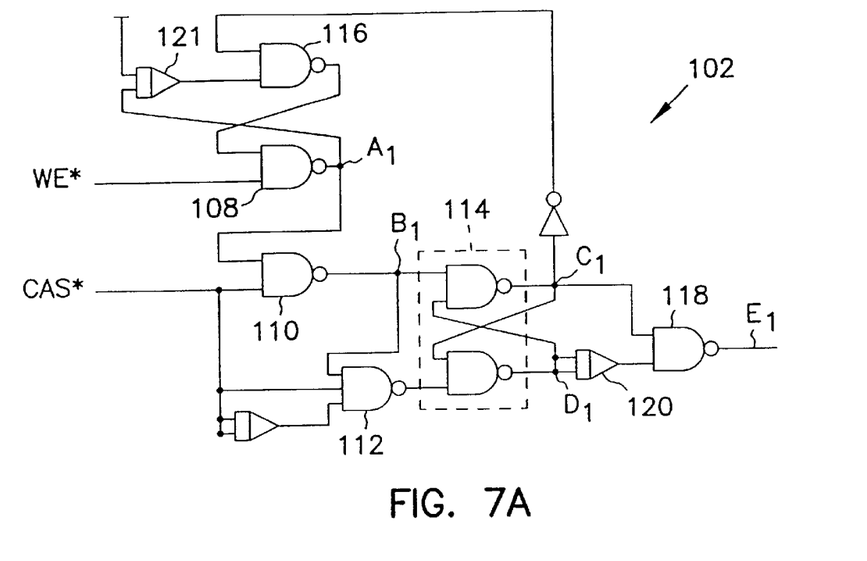
FIG. 7a is a high transition latch of the circuit of FIG. 5.
Figure 7B:
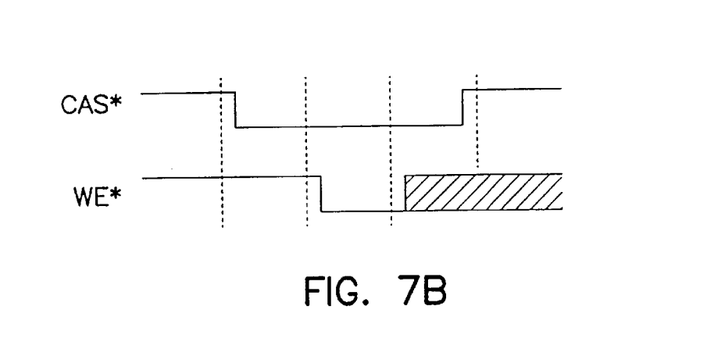
Figure 7C:
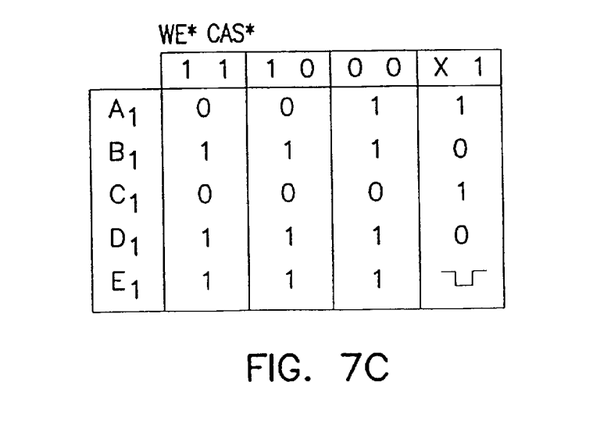
FIG. 7c is a logic table of the timing diagram of FIG. 7b.

The pulse trapping circuit 100 includes low transition latch 102, high transition latch 104, and a NEW BURST pulse generator 106. The low transition latch 102 is described in detail with reference to FIGS. 7a, 7b, and 7c. At an initial time when both CAS* and WE* are high, the output of NAND gate 108 (node $A_1$) would be stabilized at a low logic state (0). The output of NAND gate 110 (Node $B_1$), therefore, is a high logic state (1). NAND gate 112 in response produces a low output. The outputs of flip-flop 114, Nodes $C_1$ and $D_1$, are low and high, respectively. The output, Node $E_1$, of the low transition latch 102 will be normally high. When the CAS * signal transitions low, NAND gates 110 and 112 are "enabled". That is, Node $B_1$ will remain high regardless of the state of Node $A_1$, and the output of NAND 112 will change to high. With both inputs to flip-flop 114 high, nodes $C_1$ and $D_1$ will remain in their prior state. If the WE* signal transitions low while the CAS* signal is low, Node $A_1$ will latch to a high state and remain at that state even if WE* returns high. When CAS* transitions high, Node $B_1$ will go low, and Nodes $C_1$ and $D_1$ will go high and low, respectively. Delay element 120 will maintain a high output such that both inputs to NAND gate 118 are high. Node $E_1$, therefore, will pulse low. The length of the pulse is directly dependent upon the length of delay element 120. Thus, low transition latch 102 produces a low pulse if WE* transitions low when CAS* is low. Delay element 121 is included between Node $A_1$ and NAND gate 116 as a filter for the WE* signal. If WE* pulses low for a time period less than the delay time, Node $A_1$ will not latch high. This delay therefore reduces the chance that noise on the WE* line will trigger the latch.

Figure 6A:
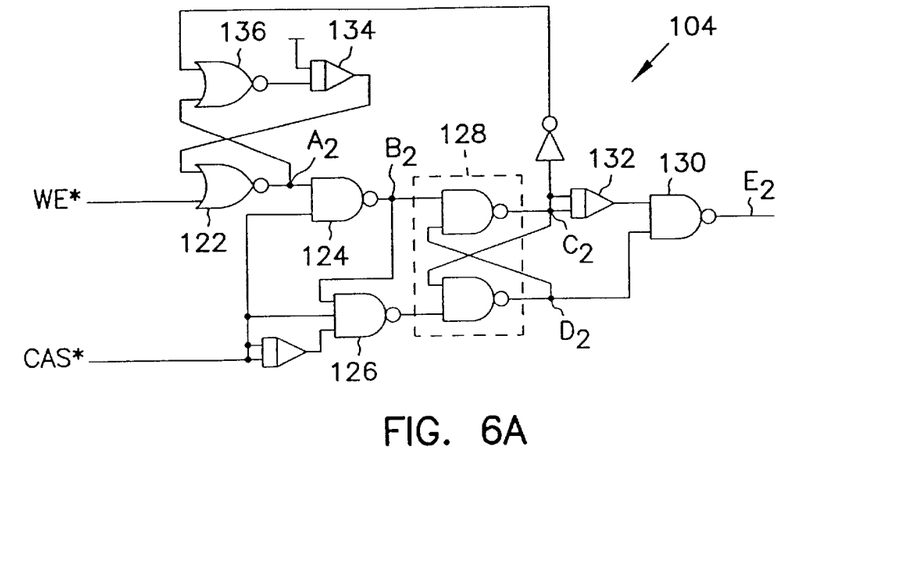
FIG. 6a is a low transition latch of the circuit of FIG. 5.
Figure 6B:
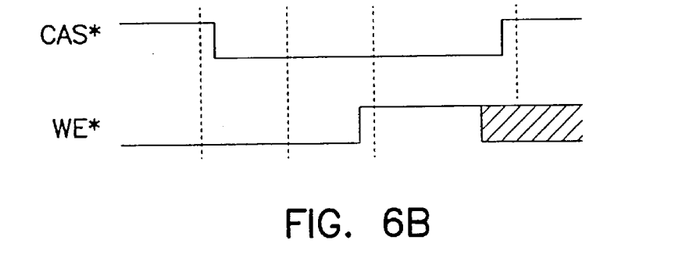
Figure 6C:
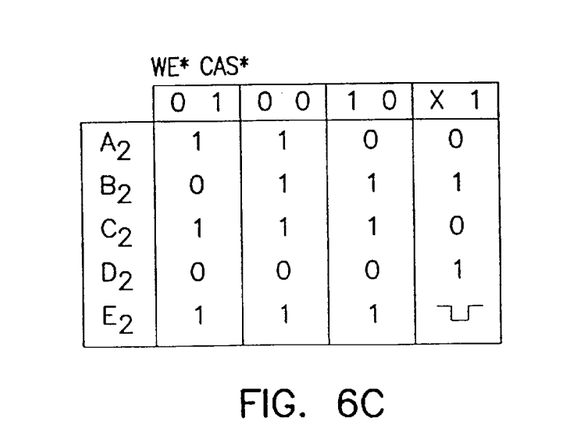
FIG. 6c is a logic table of the timing diagram of FIG. 6b.

The high transition latch 104 is described in detail with reference to FIG. 6a, 6b and 6c. In an initial state when CAS* is high and WE* is low, the output (Node $A_2$) of NOR gate 122 will be stabilized at a high state (1). NAND gate 124 will hold Node $B_2$ low. Flip-Flop 128 will, therefore, pull Node $C_2$ high and hold Node $D_2$ low. When CAS* transitions low, Node $B_2$ is held high regardless of the state of Node $A_2$. Both inputs to flip-flop 128 will be high, and Nodes $C_2$ and $D_2$ will remain at their prior states. If WE* transitions high while CAS* is low, Node $A_2$ will latch low and remain there even if WE* returns low. The output of NAND gate 126 will go low when CAS* transitions high. Nodes $C_2$ and $D_2$ will, therefore, go low and high, respectively. Delay element 132 will maintain a high output such that both inputs to NAND gate 130 are high. Node $E_2$, therefore, will pulse low. The length of the pulse is directly dependent upon the length of delay element 132. Thus, high transition latch 104 produces a low pulse if WE* transitions high when CAS* is low. Delay element 134 is included between NOR gate 136 and NOR gate 122 as a filter for the WE* signal. If WE* pulses high for a time period less than the delay time, Node $A_1$ will not latch low. This delay therefore reduces the chance that noise on the WE* line will trigger the latch.

Figure 5:
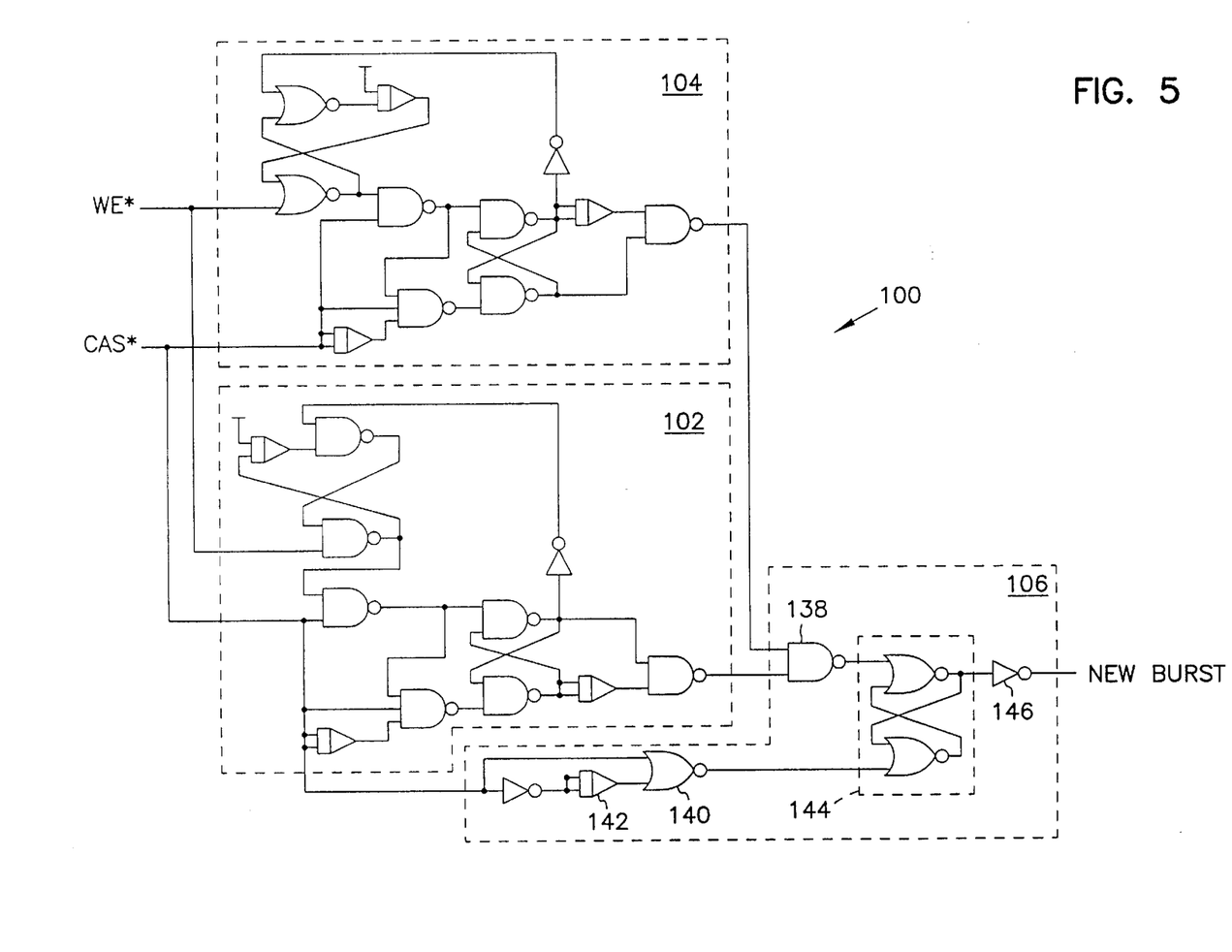
FIG. 5 is a pulse trapping circuit of FIG. 1.

Pulse trapping circuit 100 enables either low transition latch 102 or high transition latch 104 when CAS* goes low. If the enabled latch circuit 102 or 104 detects a transition in the WE* signal a low pulse is produced on Node E when the CAS* signal transitions high. NEW BURST pulse generator 106, shown in FIG. 5, is included with the pulse trapping circuit to produce a signal indicating that a new burst access is to be initiated. As stated above, a current burst is to be terminated and a new burst initiated on a CAS* rising transition when the WE* signal transitions states. The NEW BURST signal will pulse high on a CAS* high transition if either $E_1$ or $E_2$ are low. That is, if either $E_1$ or $E_2$ are low the output of NAND gate 138 will be high. Because the output of NOR gate 140 is normally low, flip-flop 144 will force NEW BURST high via inverter 146. If $E_1$ and $E_2$ are high, NEW BURST will remain low. To reset the latch when CAS* goes low, the output of NOR gate 140 pulses high in response to a CAS* low transition. The high pulse length is dictated by delay element 142.

Figure 8:
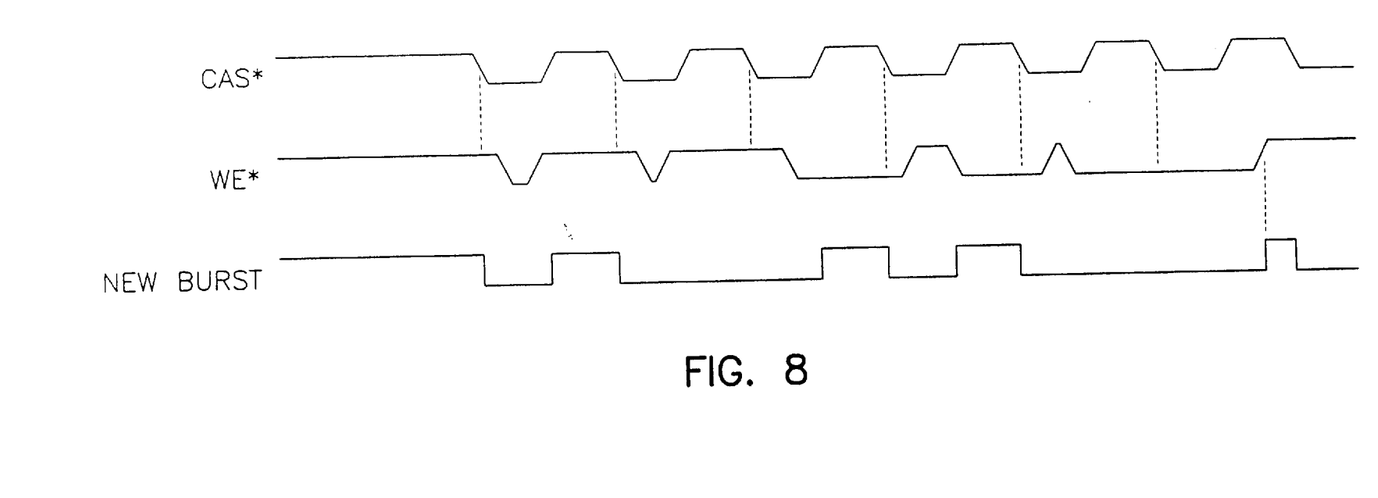
FIG. 8 is a timing diagram of the circuit of FIG. 5.

FIG. 8 illustrates the operation of the pulse trapping circuit. On the first CAS* falling edge WE* is high. The low transition latch 102 latches a low pulse such that NEW BURST goes high on the rising edge of CAS*. The current burst operation is terminated and a new burst read is initiated. NEW BURST will return low on the falling edge of CAS* and remain low until the third rising edge of CAS*. The short pulse on WE* is filtered by delay element 121 and NEW BURST is not pulsed. The third CAS* rising edge terminates the burst read operation and initiates a burst write operation. The fourth CAS* falling edge enables the high transition latch circuit 104. A NEW BURST high pulse is produced on the next CAS* rising edge in response to the WE* high pulse. Again, the short WE* pulse is filtered by delay element 134 such that noise on the WE* line does not trigger the latch. Further, if WE* transitions while CAS* is high a NEW BURST signal will be immediately produced, as illustrated in FIG. 8. This provides a direct control of new memory access burst without waiting for a CAS* low transition.

CONCLUSION

A memory circuit has been described which has burst access capabilities. A write enable signal (WE*) provided on a WE* input can be used to terminate a burst access operation. To facilitate a fast burst termination, circuitry has been described which latches a transition in the WE* line when CAS* is low. The circuitry enables one of two latches based upon the state of WE* when CAS* transitions low. If WE* pulses during the CAS* cycle a NEW BURST signal is produced. The NEW BURST signal is used to terminate a current burst access operation and initiate a new burst read or write operation.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated memory device comprising:

a control signal input for receiving a control signal;

an address latch input for receiving an address latch signal; and means for a latching a transition in the control signal when the address latch signal is activated.

2. The integrated memory device of claim 1 wherein the means for a latching a transition in the control signal latches a low to high transition in the control signal when the address latch signal is activated.

3. The integrated memory device of claim 2 wherein the means for a latching comprises a high transition latch circuit to latch a low to high transition in the control signal when the address latch signal is activated, the high transition latch circuit comprises:

a first flip-flop circuit having first and second inputs, and an output, the first input is coupled to the control signal input;

a first logic gate having a first input connected to the output of the first flip-flop circuit, a second input connected to the address latch input, and an output;

a second flip-flop circuit having a first input connected to the output of the first logic gate, a second input, and first and second outputs;

a second logic gate having an output connected to the second input of the second flip-flop circuit, a first input connected to the output of the first logic gate, and a second input connected to the address latch input;

a feedback circuit connected to the first output of the second flip-flop circuit and the second input of the first flip-flop circuit; and an output circuit connected to the first and second outputs of the second flip-flop circuit.

4. An integrated memory device comprising:

a control signal input for receiving a control signal;

an address latch input for receiving an address latch signal; and a signal trapping circuit coupled to the control signal input and the address latch input and adapted to latch a transition in the control signal, wherein the signal trapping circuit comprises:

a high transition latch circuit to latch a low to high transition in the control signal when the address latch signal is activated, the high transition latch circuit comprises:

a first flip-flop circuit having first and second inputs, and an output, the first input is coupled to the control signal input, a first logic gate having a first input connected to the output of the first flip-flop circuit, a second input connected to the address latch input, and an output;

a second flip-flop circuit having a first input connected to the output of the first logic gate, a second input, and first and second outputs;

a second logic gate having an output connected to the second input of the second flip-flop circuit, a first input connected to the output of the first logic gate, and a second input connected to the address latch input;

a feedback circuit connected to first output of the second flip-flop circuit and the second input of the first flip-flop circuit; and an first output circuit connected to the first and second outputs of the second flip-flop circuit a low transition latch circuit to latch a high to low transition in the control signal when the address latch signal is activated, the low transition latch circuit comprises:

a third flip-flop circuit having first and second inputs, and an output, the first input is coupled to the control signal input, a third logic gate having a first input connected to the output of the third flip-flop circuit, a second input connected to the address latch input, and an output;

a fourth flip-flop circuit having a first input connected to the output of the third logic gate, a second input, and first and second outputs;

a fourth logic gate having an output connected to the second input of the fourth flip-flop circuit, a first input connected to the output of the third logic gate, and a second input connected to the address latch input;

a feedback circuit connected to the first output of the fourth flip-flop circuit and the second input of the third flip-flop circuit; and an second output circuit connected to the first and second outputs of the fourth flip-flop circuit.

5. The integrated memory of claim 4 further comprising:

a filter circuit coupled to the first flip-flop circuit for filtering a high pulse in the control signal which has a duration less than a predetermine time.

6. The integrated memory of claim 5 wherein the filter circuit is a delay element.

7. The integrated memory of claim 4 wherein the first and second logic gates are NAND gates.

8. The integrated memory of claim 4 wherein the first flip-flop circuit comprises cross coupled NOR gates.

9. The integrated memory of claim 4 wherein the second flip-flop circuit comprises cross coupled NAND gates.

10. The integrated memory of claim 4 wherein the first output circuit comprises:

a NAND gate having a first input coupled through a delay circuit to the first output of the second flip-flop circuit, and a second input connected to the second output of the second flip-flop circuit.

11. The integrated memory of claim 4 further comprising:

a filter circuit coupled to the third flip-flop circuit for filtering a low pulse in the control signal which has a duration less than a predetermine time.

12. The integrated memory of claim 11 wherein the filter circuit is a delay element.

13. The integrated memory of claim 4 wherein the third and fourth logic gates are NAND gates.

14. The integrated memory of claim 4 wherein the third flip-flop circuit comprises cross coupled NAND gates.

15. The integrated memory of claim 4 wherein the fourth flip-flop circuit comprises cross coupled NAND gates.

16. The integrated memory of claim 4 wherein the second output circuit comprises:

a NAND gate having a first input coupled through a delay circuit to the second output of the second flip-flop circuit, and a second input connected to the first output of the second flip-flop circuit.

17. A method of latching a control signal in a memory circuit having a control signal input and an address latch input, the method comprising the steps of:

receiving an address latch signal on the address latch input;

receiving a control signal on the control signal input;

filtering the control signal to eliminate a control signal which has a duration that is shorter than a pre-determined time;

enabling a latch circuit in response to an active transition of the address latch signal; and latching a transition of the control signal.

18. The method of claim 17 further including the step of:

producing an output signal in response to the transition of the control signal.

19. The method of claim 17 wherein the control signal is a write enable signal.

20. The method of claim 17 wherein the address latch signal is a column address latch signal (CAS).

21. A method of generating an burst control signal in a memory circuit having a control signal input and an address latch input, the method comprising the steps of:

receiving a column address latch signal on the address latch input;

receiving a write enable control signal on the control signal input;

filtering the write enable control signal to eliminate a write enable control signal which has an active state duration that is shorter than a pre-determined time;

filtering the write enable control signal to eliminate a write enable control signal which has an inactive state duration that is shorter than a pre-determined time;

enabling a latch circuit in response to an active transition of the address latch signal; and latching a transition of the write enable control signal.

22. The method of claim 21 wherein the write enable control signal is an active low state.

23. The method of claim 21 further comprising the step of producing a Newburst output signal in response to the column address latch signal and the write enable control signal.

* * * * *

UNITED STATES PATENT AND TRADEMARK OFFICE
CERTIFICATE OF CORRECTION

PATENT NO. : 5,831,932
DATED : November 3, 1998
INVENTOR(S) : Todd Merritt, Boise; Brett Williams It is certified that error appears in the above-identified patent and that said Letters Patent is hereby corrected as shown below:

At Col. 8, line 45, please delete "for a latching" and insert -- for latching --

At Col. 8, line 48, please delete "for a" and insert -- for --

At Col. 9, line 22, please delete "input," and insert -- input; --.

At Col. 9, line 34, please delete "to first" and insert -- to the first --

At Col. 9, line 37, please delete "an first" and insert -- a first --

At Col. 9, line 39, please delete "circuit" and insert -- circuit; --

At Col. 9, line 45, please delete "input," and insert -- input; --

At Col. 9, line 61, please delete "an second" and insert -- a second --
At Col. 9, line 66, please delete "predetermine" and insert -- predetermined --
At Col. 10, line 18, please delete "predetermine" and insert -- predetermined --
At Col. 10, line 54, please delete "an burst" and insert -- a burst --

Signed and Sealed this

Fourteenth Day of March, 2000

Attest:

Q. TODD DICKINSON

*Attesting Officer*  *Commissioner of Patents and Trademarks*